United States Patent
Wang et al.

(10) Patent No.: US 9,355,838 B2
(45) Date of Patent: May 31, 2016

(54) OXIDE TFT AND MANUFACTURING METHOD THEREOF

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Zuqiang Wang, Beijing (CN); Won Seok Kim, Beijing (CN); Zhengping Xiong, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

( * ) Notice: Subject to any disclaimer, the term of this patent is extended or adjusted under 35 U.S.C. 154(b) by 68 days.

(21) Appl. No.: 13/880,823

(22) PCT Filed: Nov. 12, 2012

(86) PCT No.: PCT/CN2012/084469
§ 371 (c)(1),
(2) Date: Apr. 22, 2013

(87) PCT Pub. No.: WO2013/104209
PCT Pub. Date: Jul. 18, 2013

(65) Prior Publication Data
US 2014/0061633 A1    Mar. 6, 2014

(30) Foreign Application Priority Data

Jan. 13, 2012  (CN) .......................... 2012 1 0011025

(51) Int. Cl.
H01L 29/66    (2006.01)
H01L 21/02    (2006.01)
H01L 29/786    (2006.01)

(52) U.S. Cl.
CPC .... *H01L 21/02252* (2013.01); *H01L 21/02172* (2013.01); *H01L 21/02244* (2013.01); *H01L 29/66969* (2013.01); *H01L 29/7869* (2013.01); *H01L 29/78606* (2013.01)

(58) Field of Classification Search
CPC ............ H01L 29/786; H01L 29/78606; H01L 29/4175; H01L 29/41733; H01L 21/02172; H01L 21/02244; H01L 21/02252
See application file for complete search history.

(56) References Cited

U.S. PATENT DOCUMENTS 7,442,588 B2   10/2008   Jang et al.
8,058,086 B2 * 11/2011   Bach .................... H01L 21/3065
                                                       257/618

(Continued)

FOREIGN PATENT DOCUMENTS

CN      101740636 A    6/2010
CN      101794819 A    8/2010

(Continued)

OTHER PUBLICATIONS

International Search Report; mailed Jul. 2, 2013; PCT/CN2012/084469.

(Continued)

*Primary Examiner* — Matthew W Such
*Assistant Examiner* — Stephen C Smith
(74) *Attorney, Agent, or Firm* — Ladas & Parry LLP

(57) ABSTRACT

Embodiments of the invention provide an oxide TFT and a manufacturing method thereof. The oxide thin film transistor comprises: a substrate; a gate electrode formed on the substrate; a gate insulation layer covering the gate electrode; an oxide active layer formed on the gate insulation layer and comprising a source region, a drain region, and a channel between the source region and the drain region; an etching barrier layer entirely covering the active layer and the gate insulation layer; and a source electrode and a drain electrode formed on the etching barrier layer and respectively provided on both sides of the channel. The etching barrier layer is a metal layer. The oxide thin film transistor further comprises a channel protective layer, which is a non-conductive oxidation layer converted from the metal layer by performing an oxidation treatment on the metal layer.

7 Claims, 4 Drawing Sheets

(56) References Cited

U.S. PATENT DOCUMENTS

| | | | |
|---|---|---|---|
| 8,158,466 B2* | 4/2012 | Kim | H01L 27/1214 257/E27.111 |
| 8,247,276 B2* | 8/2012 | Kondo et al. | 438/151 |
| 8,722,547 B2* | 5/2014 | Mani | H01L 21/31116 216/62 |
| 8,728,861 B2* | 5/2014 | Bayraktaroglu et al. | 438/104 |
| 8,748,878 B2* | 6/2014 | Yamaguchi et al. | 257/41 |
| 8,759,228 B2* | 6/2014 | Wilson | H01L 21/31122 257/E21.483 |
| 2002/0079057 A1* | 6/2002 | Yoshioka | C23F 4/00 156/345.31 |
| 2005/0090113 A1* | 4/2005 | Chang | H01L 21/32138 438/704 |
| 2008/0206935 A1 | 8/2008 | Jang et al. | |
| 2010/0123131 A1* | 5/2010 | Tokunaga | 257/43 |
| 2010/0176388 A1* | 7/2010 | Ha | H01L 29/7869 257/40 |
| 2010/0213460 A1 | 8/2010 | Kondo et al. | |
| 2010/0224873 A1 | 9/2010 | Sakata et al. | |
| 2011/0156025 A1* | 6/2011 | Shionoiri | H01L 27/115 257/43 |
| 2011/0163329 A1* | 7/2011 | Kim | H01L 27/1214 257/88 |
| 2012/0119211 A1* | 5/2012 | Lin et al. | 257/57 |
| 2012/0175610 A1* | 7/2012 | Yamazaki | H01L 29/7869 257/43 |
| 2012/0273773 A1* | 11/2012 | Ieda | H01L 27/105 257/43 |
| 2013/0037807 A1* | 2/2013 | Fukaya | H01L 27/1225 257/57 |

FOREIGN PATENT DOCUMENTS

| | | |
|---|---|---|
| CN | 101814529 A | 8/2010 |
| CN | 101826558 A | 9/2010 |
| CN | 102629628 A | 8/2012 |
| CN | 102646699 A | 8/2012 |
| CN | 203646699 A | 8/2012 |

OTHER PUBLICATIONS

International Search Report mailed Jul. 2, 2013; PCT/CN2012/084469.
First Chinese Office Action dated Jan. 28, 2014; Appln. No. 201210011025.2.
International Preliminary Report on Patentability dated Jul. 15, 2014; PcT/CN2012084469.
Baek, Kye Hyun et al., "Role of O2 in Aluminum Etching with BCl3/Cl2/O2 Plasma in High Density Plasma Reactor", Japanese Journal of Applied Physics vol. 38, Oct. 10, 1999, pp. 5829-5834.
Second Chinese Office Action Appln. No, 201210011025.2; Dated Aug. 26, 2014.

* cited by examiner

OXIDE TFT AND MANUFACTURING METHOD THEREOF

FIELD OF THE INVENTION

Embodiments of the invention relate to an oxide thin film transistor (TFT) and a manufacturing method thereof.

BACKGROUND

Presently, more and more attentions are paid on oxide TFT, which uses an oxide semiconductor layer as an active layer. The oxide TFT has advantages of high carrier mobility, low cost and compatible with the existing α-Si TFT production line.

Hereinafter, several typical structures of the conventional oxide TFT are described.

FIG. 1 is a structural schematic view of a conventional oxide TFT. As shown in FIG. 1, the conventional oxide TFT comprises: a substrate 110; a gate electrode 120 formed on the substrate; an insulation layer 130 covering the gate electrode 120; an active layer 140 formed on the insulation layer 130; a source electrode 151 and a drain electrode 152 formed on both sides of the active layer 140; and a passivation layer 160 covering the active layer 140 as well as the source electrode 151 and the drain electrode 152. Disadvantages of this TFT structure are in that: etching damages occur on the surface of the active layer 140 in the process of forming the source electrode 151 and the drain electrode 152 so that the electrical performance of the TFT decreases, and the active layer will be subjected to other damages in subsequent processes because its surface is exposed.

FIG. 2 is a structural schematic view of another conventional oxide TFT. As shown in FIG. 2, this conventional oxide TFT comprises: a substrate 210; a gate electrode 220 formed on the substrate 210; an insulation layer 230 covering the gate electrode 220; an active layer 240 formed on the insulation layer 230; an etching barrier layer 250 provided on the active layer 240; a source electrode 261 and a drain electrode 262 provided on both sides of the active layer 240 and the etching barrier layer 250; and a passivation layer 270 provided in the topmost layer and covering the whole device. Unlike the structure of the TFT shown in FIG. 1, the TFT shown in FIG. 2 has the etching barrier layer 250. The function of the etching barrier layer is: preventing the surface of the active layer 240 from being etch-damaged in the process of forming the source electrode 261 and the drain electrode 262. Disadvantage of this TFT structure are in that: the surface of the active layer 240 may subject to plasma bombardment in the process of forming the etching barrier layer 250 so that the electrical performance of the active layer 240 may be degraded. Further, because the etching barrier layer is provided on the active layer, there exists a problem of providing an additional mask for the etching barrier layer.

FIG. 3 is a structural schematic view of another conventional oxide TFT. As shown in FIG. 3, the conventional oxide TFT comprises: a substrate 310, a gate electrode 320, an insulation layer 330, an active layer 340, a barrier layer 350, via holes 351 and 352, a source electrode 361, a drain electrode 362, and a passivation layer 370. Disadvantages of this TFT structure are in that: the active layer 340 still subjects to damages when forming the barrier layer 350 although the barrier layer 350 provides a certain protection for the active layer, and an additional mask is also needed to form the via holes 351 and 352.

FIG. 4 is a structural schematic view of another conventional oxide TFT. As shown in FIG. 4, a gate electrode 320' and a gate insulation layer 330' are formed on a substrate 310' in this order. Then, a source electrode 341' and a drain electrode 342' are formed, and finally an active layer 350' is formed. This structure can avoid the etch damages to the active layer. However, because the active layer is exposed, the damages to the active layer in the subsequent processes can not be avoided.

SUMMARY OF THE INVENTION

According to an embodiment of the invention, there is provided an oxide thin film transistor. The oxide thin film transistor comprises: a substrate; a gate electrode formed on the substrate; a gate insulation layer covering the gate electrode; an oxide active layer formed on the gate insulation layer and comprising a source region, a drain region, and a channel located between the source region and the drain region; an etching barrier layer entirely covering the active layer and the gate insulation layer; and a source electrode and a drain electrode formed on the etching barrier layer and respectively provided on both sides of the channel. The etching barrier layer is a metal layer. The oxide thin film transistor further comprises a channel protective layer, and the channel protective layer is a non-conductive oxidation layer converted from the metal layer by performing an oxidation treatment on the metal layer.

According to another embodiment of the invention, there is provided a method of manufacturing an oxide thin film transistor. This method comprises: forming a conductive film on a substrate and forming a gate electrode by a patterning process; forming an insulation film on the substrate to cover the gate electrode and function as a gate insulation layer; and forming an oxide film on the gate insulation layer and forming an active layer comprising a source region, a drain region and a channel by a patterning process. The method further comprises: sequentially forming a lower metal film and an upper metal film on the active layer, forming a source electrode and a drain electrode by performing a patterning process on the upper metal film which is away from the active layer, and remaining the lower metal film which is adjacent to the active layer. The lower metal film functions as an etching barrier layer, and a non-conductive oxidation layer converted from the lower metal film by performing an oxidation treatment on the lower metal film functions as a channel protective layer.

According to the embodiments of the invention, the etching barrier layer is formed of metal layer, the metal layer is converted into the non-conductive oxidation layer by the oxidation treatment, and the obtained oxidation layer functions as the channel protective layer to protect the channel.

According to the embodiments of the invention, the etching barrier layer formed of the metal layer is directly converted into the oxidation layer by the oxidation treatment, and the obtained non-conductive oxidation layer is in turn function as the channel protective layer to protect the channel. Thus, damages to the channel can be prevented, and thus a decrease in electrical performance of the TFT resulting from the damages to the channel can be avoided.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE EMBODIMENTS

Figure 1:
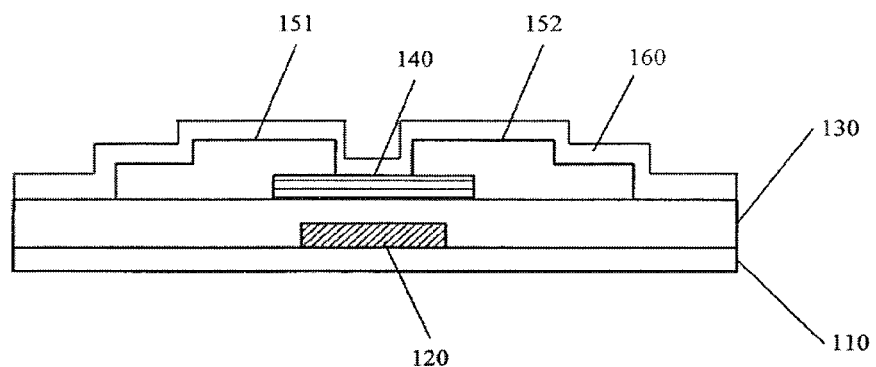
FIG. 1 is a structural schematic view of a conventional oxide TFT.
Figure 2:
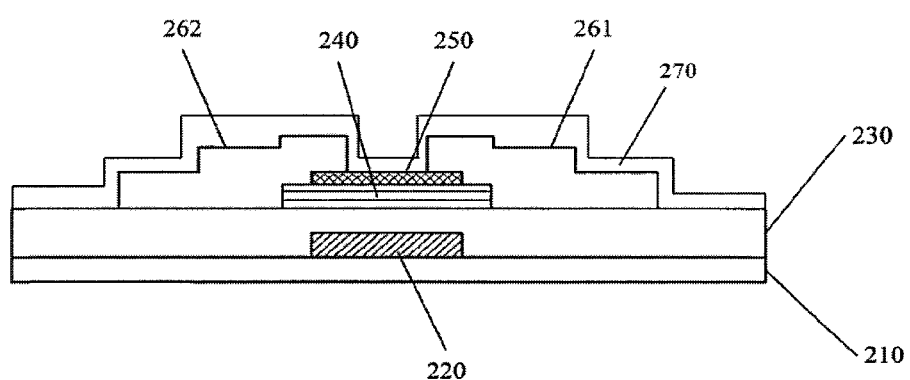
FIG. 2 is a structural schematic view of another conventional oxide TFT.
Figure 3:
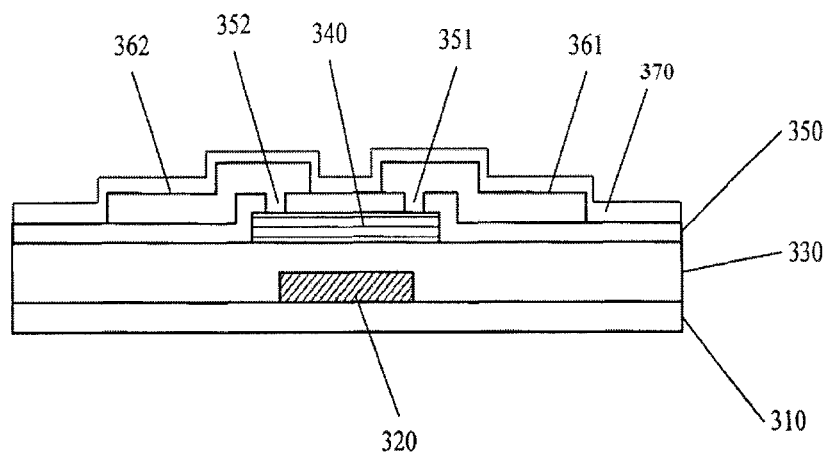
FIG. 3 is a structural schematic view of another conventional oxide TFT.
Figure 4:
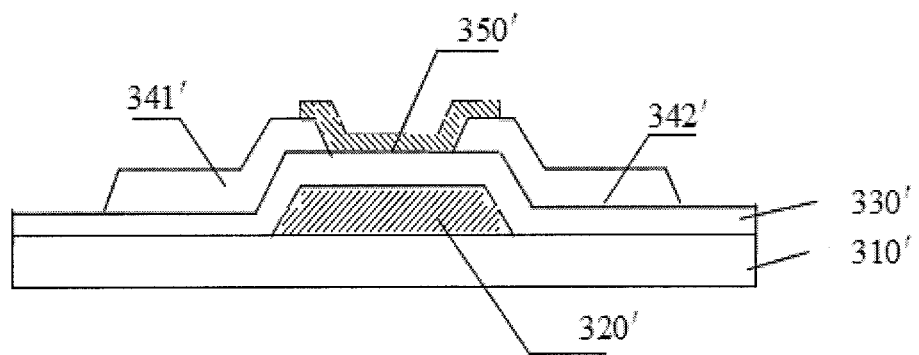
FIG. 4 is a structural schematic view of another conventional oxide TFT.

In order to make objects, technical solutions and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

The basic ideas of the embodiments of the invention are as follows: the etching barrier layer is a metal layer, a portion of the metal layer is converted into a non-conductive oxidation layer by an oxidation treatment, and the obtained oxidation layer functions as the channel protective layer to protect the channel of the TFT.

According to an embodiment of the invention, an oxide TFT comprises: a substrate; a gate electrode formed on the substrate; a gate insulation layer covering the gate electrode; an active layer formed on the gate insulation layer and comprising a source region, a drain region and a channel located between the source region and the drain region; an etching barrier layer covering the entire surface of the active layer and the gate insulation layer; and a source electrode and a drain electrode formed on the etching barrier layer and respectively provided on both sides of the channel. The etching barrier layer is a metal layer. The thin film transistor further comprises a channel protective layer, and the channel protective layer is a non-conductive oxidation layer converted from the metal layer by performing an oxidation treatment on the metal layer.

For example, the oxidation treatment is an oxygen plasma oxidation treatment, and other similar oxidation methods may be employed as well.

For example, the metal layer is formed of titanium, or other metals capable of converting into non-conductive dielectric film by the oxygen plasma oxidation treatment.

For example, the active layer is formed by an oxide semiconductor material.

For example, the oxide semiconductor material contains at least one of the metals such as indium, gallium, zinc and the like.

In addition, the etching barrier layer comprises a channel etching barrier layer, and the channel etching barrier layer is located above the channel and corresponds to the position of the channel. The non-conductive oxidation layer obtained by performing the oxidation treatment on the channel etching barrier layer functions as the channel protective layer.

According to an embodiment of the invention, a method for manufacturing an oxide TFT comprises: forming a conductive film on a substrate and forming a gate electrode through a patterning process; forming an insulation film on the substrate to cover the gate electrode and functions as a gate insulation layer; forming an oxide film on the gate insulation layer and forming an active layer comprising a source region, a drain region and a channel through a patterning process.

This method further comprises: sequentially forming two metal films (i.e. a lower metal film and an upper metal film) on the active layer, forming a source electrode and a drain electrode by performing a patterning process on the upper metal film which is away from the active layer, and remaining the lower metal film which is adjacent to the active layer. The lower metal film functions as an etching barrier layer, and a non-conductive oxidation layer formed by performing an oxidation treatment on the lower metal film functions as a channel protective layer.

The above-described patterning processes comprise the steps of exposing and developing, etching, peeling off and the like.

For example, the oxidation treatment is an oxygen plasma oxidation treatment, and other similar oxidation methods may be employed as well.

For example, the lower metal layer is formed of titanium, or other metals capable of converting into non-conductive dielectric film by the oxygen plasma oxidation treatment. The upper metal film is formed of a metal such as molybdenum, or an alloy. When the lower metal film is formed of titanium, the lower metal film serves as the etching barrier layer in the process of forming the source electrode and the drain electrode, so that damages to the channel by an etching solution such as $H_3PO_4$ are avoided. The metal layer (for example, a titanium layer) located above the channel is convert into the oxide dielectric layer (for example, a titanium oxide layer) by the oxygen plasma treatment, and this oxide dielectric layer functions as the channel protective layer in the subsequent processes. The portion of the upper metal film provided above the channel is removed so as to form the source electrode and the drain electrode.

For example, the oxygen plasma used in the oxygen plasma oxidation treatment comprises a mixed gas of $O_2$ and $BCl_2$, the proportion between $O_2$ and $BCl_2$ is $O_2/BCl_2=2-3$, and the treatment time is 100-300 seconds.

When the oxygen plasma oxidation treatment satisfies the above mentioned proportion and treatment time, a relatively better treatment effect is obtained, that is, the converting of the metal layer above the channel into the oxide dielectric layer is sufficient. When the proportion is $O_2/BCl_2=2.5$ and the treatment time is 200 seconds, a more better treatment effect is obtained, and the converting of the metal layer above the channel into the oxide dielectric layer is more sufficiently.

According to the above embodiments, the TFT with excellent stability can be manufactured in a convenient manner without increasing the number of masks. On the one hand, by using the metal layer as the etching barrier layer to prevent solutions and the like from entering the channel in the etching process, the problem of the TFT being damaged by the etching solution and the like in the etching process can be solved. On the other hand, by utilizing the oxidation treatment to convert the metal layer above the channel into the non-conductive oxidation layer so as to prevent oxygen (O), hydrogen (H) and the like from affecting the channel in the subsequent process of forming the passivation layer, damages to the channel by the plasma in the subsequent film forming process can be avoided. Therefore, a double protection to the channel can be obtained. Due to the double protection to the channel, the electrical stability of the TFT can be improved. Compared with the conventional oxide TFT having the etching barrier layer, the oxide TFT according to the embodiments of the invention have the advantages of less masks, simpler process and double protection to the channel and the like.

Hereinafter, the embodiments of the invention will be further described in conjunction with the accompany drawings.

Figure 5:
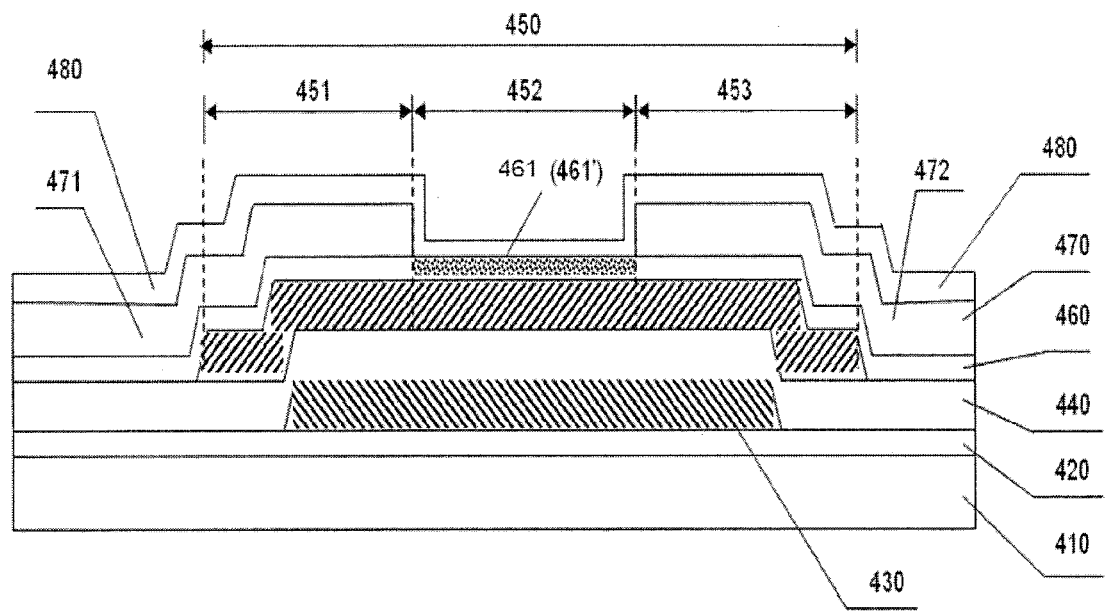
FIG. 5 is a structural schematic view of a oxide TFT according to an embodiment of the invention.

FIG. 5 is a structural schematic view of a TFT according to an embodiment of the invention. As shown in FIG. 5, the TFT according to the embodiment of the invention comprises: a substrate 410; a buffer layer 420 covering the substrate 410; a gate electrode 430 formed on the buffer layer 420; a gate insulation layer 440 covering the gate electrode 430; an oxide active layer 450 provided on the gate insulation layer 440 and comprising a channel 452, a source region 451 and a drain region 453; an etching barrier layer 460 formed of a metal film and entirely covering the channel 452, the source region 451, the drain region 453 and the gate insulation layer 440; an electrode 470 formed of another metal film and comprising a source electrode 471 and a drain electrode 472; and a passivation layer 480 covering an entire surface of the TFT. A portion of the etching barrier layer 460 provided directly on the channel 452 is referred as a channel etching barrier layer 461, the channel etching barrier layer 461 is converted into a non-conductive dielectric layer by an oxygen plasma treatment, and the non-conductive dielectric layer is referred to as a channel protective layer 461'.

Preferably, the etching barrier layer 460 is formed of titanium, or other metals capable of converting into non-conductive dielectric film by the oxygen plasma oxidation treatment.

Preferably, the active layer 450 is formed of an oxide semiconductor containing at least one of indium, gallium and zinc.

Further, the TFT according to the embodiments of the invention may not include the buffer layer 420, and thus the gate electrode 430 is directly formed on the substrate 410. Further, the passivation layer 480 may not be formed.

FIGS. 6-9 are schematic views of a series of processes during a manufacturing method of a TFT according to the embodiments of the invention.

Figure 6:
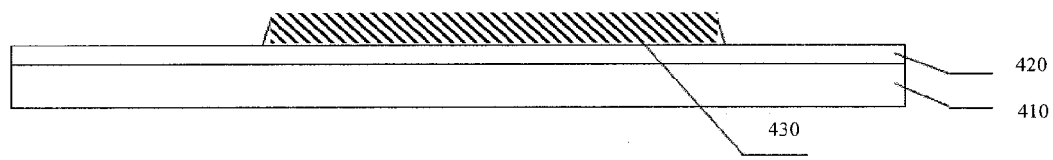
FIG. 6 is a schematic process view of a manufacturing method of the oxide TFT according to the embodiment of the invention.

For example, as shown in FIG. 6, a silicon oxide of 500-1000 Å is formed on the substrate 410 so as to form the buffer layer 420. A molybdenum metal film of 2500-3000 Å is formed on the buffer layer 420 so as to form the gate electrode 430 by a patterning process.

Figure 7:
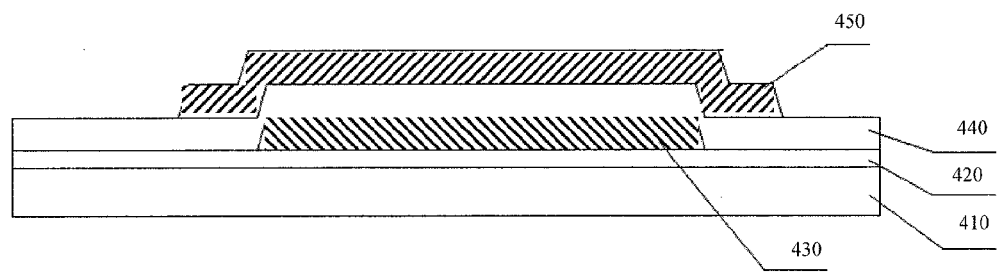
FIG. 7 is a schematic process view of the manufacturing method of the oxide TFT according to the embodiment of the invention.

For example, as shown in FIG. 7, a silicon nitride of 3000-4000 Å is formed on the gate electrode 430 so as to form the gate insulation layer 440. This gate insulation layer 440 entirely covers the gate electrode 430. Then, an indium-gallium-zinc oxide (InGaZnOx) semiconductor layer of 600-1000 Å is deposited to form the active layer 450 by a patterning process.

Figure 8:
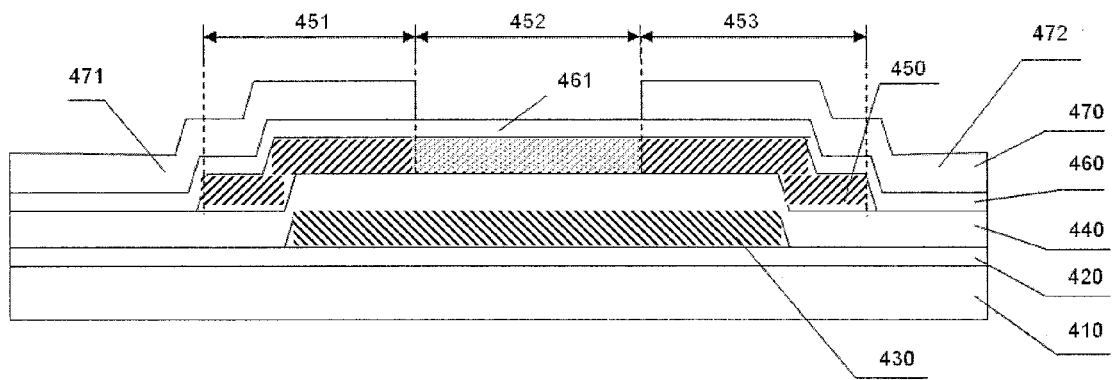
FIG. 8 is a schematic process view of the manufacturing method of the oxide TFT according to the embodiment of the invention.

For example, as shown in FIG. 8, a titanium metal film with a thickness of 100-200 Å and a molybdenum metal film with a thickness of 1800-2000 Å are formed in this order. The titanium metal film functions as the etching barrier layer 460, and the etching barrier layer 460 comprises the channel etching barrier layer 461. The electrode 470 is formed by the molybdenum metal film by a patterning process, and the electrode 470 comprises the source electrode 471 and the drain electrode 472.

Figure 9:
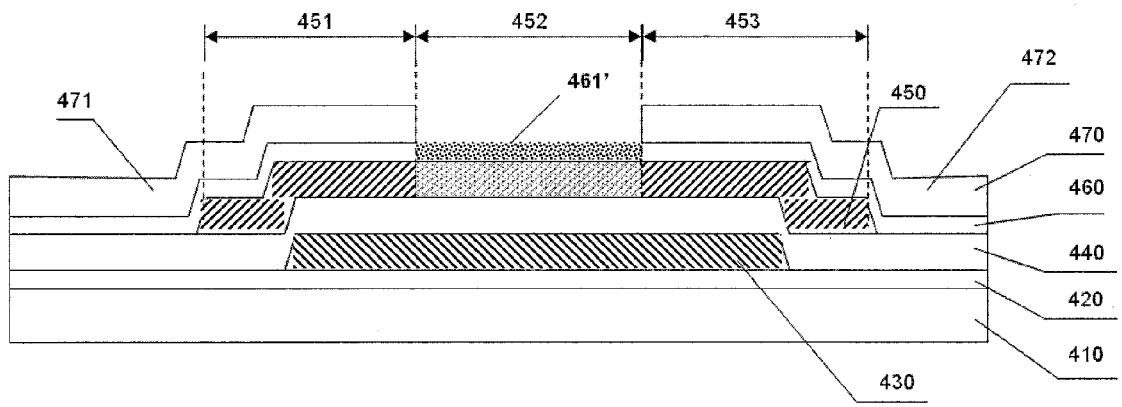
FIG. 9 is a schematic process view of the manufacturing method of the oxide TFT according to the embodiment of the invention.

For example, as shown in FIG. 9, the structure which has underwent the above mentioned processes is treated by oxygen plasma for 100-300 seconds, so that the channel etching barrier layer 461 exposed outside is oxidized and converted into the oxide dielectric layer of titanium oxide. The oxide dielectric layer of titanium oxide is used as the channel protective layer 461'. The oxygen plasma is a mixed gas of $O_2$ and $BCl_2$, the proportion of $O_2$ and $BCl_2$ is 2-3.

In the above described manufacturing method, the step of forming the buffer layer 420 may be omitted. Further, the passivation layer denoted by the reference number 480 in FIG. 5 may be formed after the channel protective layer 461' is formed.

The oxide TFT according to the embodiments of the invention may be used in an array substrate of liquid crystal display, an array substrate of OLED display and other array substrates. The manufacturing method of the oxide TFT according to the embodiments of the invention may also be used in the manufacturing methods of the array substrate of liquid crystal display, the array substrate of OLED display and other array substrates. Accordingly, in these array substrates, it is possible to prevent the decrease in electrical performance of the TFT resulting from the damages to the channel, and thus a better display quality can be obtained.

The forgoing embodiments merely are exemplary embodiments of the invention, and not intended to define the scope of the invention, and the scope of the invention is determined by the appended claims.

What is claimed is:

1. A method of manufacturing an oxide thin film transistor, comprising: forming a conductive film on a substrate and forming a gate electrode by a patterning process; forming an insulation film on the substrate to cover the gate electrode and function as a gate insulation layer; forming an oxide film on the gate insulation layer and forming an active layer comprising a source region, a drain region and a channel by a patterning process, wherein the method further comprises:
sequentially forming a lower metal film and an upper metal film on the active layer, forming a source electrode and a drain electrode by performing a patterning process on the upper metal film which is away from the active layer, and remaining the lower metal film which is adjacent to the active layer, and
wherein the lower metal film functions as an etching barrier layer, the etching barrier layer covering the active layer and the gate insulation layer;
wherein the etching barrier layer comprises a channel protective layer, the channel protective layer is located on the channel and corresponds to a position of the channel, and the channel protective layer is formed by performing an oxidation treatment on the lower metal film;
wherein the etching barrier layer is provided below the source and drain electrodes and covers both upper surface and side surface of the active layer and further covers a portion of the gate insulation layer on which the active layer is not formed, and
wherein the oxidation treatment is an oxygen plasma oxidation treatment, and an oxygen plasma employed in the oxygen plasma oxidation treatment is a mixed gas of $O_2$ and $BCl_2$.

2. The method of manufacturing the oxide thin film transistor according to claim 1, wherein the lower metal film is formed of titanium, or other metals capable of converting into the non-conductive oxidation layer by the oxygen plasma oxidation treatment.

3. The method of manufacturing the oxide thin film transistor according to claim 1, wherein the upper metal film is formed of metal or an alloy.

4. The method of manufacturing the oxide thin film transistor according to claim 3, wherein the upper metal film is formed of molybdenum.

5. The method of manufacturing the oxide thin film transistor according to claim 1, wherein, a proportion between $O_2$ and $BCl_2$ is $O_2/BCl_2=2-3$, and a treatment time is 100-300 seconds.

6. The method of manufacturing the oxide thin film transistor according to claim 5, wherein the proportion between $O_2$ and $BCl_2$ is $O_2/BCl_2=2-2.5$, and the treatment time is 100-300 seconds.

7. The method of manufacturing the oxide thin film transistor according to claim 1, wherein the method further comprises:
 forming a buffer layer on the substrate before forming the gate electrode; and/or
 forming a passivation layer after forming the channel protective layer.

* * * * *